United States Patent
Lee

(10) Patent No.: US 7,087,520 B2
(45) Date of Patent: Aug. 8, 2006

(54) METHOD FOR FABRICATING METAL WIRING

(75) Inventor: Jae-Suk Lee, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 129 days.

(21) Appl. No.: 10/902,903

(22) Filed: Jul. 30, 2004

(65) Prior Publication Data

US 2005/0023698 A1    Feb. 3, 2005

(30) Foreign Application Priority Data

Jul. 31, 2003    (KR) ................. 10-2003-0053016

(51) Int. Cl.
*H01L 21/44* (2006.01)

(52) U.S. Cl. ............ 438/652; 438/669; 438/687; 438/688; 257/E23.134; 257/E21.295

(58) Field of Classification Search ........ 438/652, 438/669, 687, 688, FOR. 405, FOR. 406; 257/E23.134, E21.295

See application file for complete search history.

(56) References Cited

U.S. PATENT DOCUMENTS

| | | | |
|---|---|---|---|
| 4,855,016 A | 8/1989 | Jucha et al. | |
| 5,795,829 A | 8/1998 | Shen | |
| 6,291,336 B1 | 9/2001 | Teng | |
| 6,635,548 B1 * | 10/2003 | Bernstein et al. | 438/387 |
| 6,841,877 B1 * | 1/2005 | Saijo et al. | 257/750 |
| 2003/0080393 A1 * | 5/2003 | Dalton et al. | 257/529 |

* cited by examiner

*Primary Examiner*—Michelle Estrada
(74) *Attorney, Agent, or Firm*—Andrew D. Fortney

(57) ABSTRACT

A semiconductor device includes a semiconductor substrate and metal wiring formed by alternately depositing aluminum layers and copper layers on the semiconductor substrate so that a top layer of the metal wiring is an aluminum layer. The metal wiring is fabricated by alternately depositing an aluminum layer and a copper layer on a semiconductor substrate a predetermined number of times to form a metal wiring layer having an aluminum top layer. A photoresist film pattern is formed on the metal wiring layer and metal wiring is formed by performing an etching process on the metal wiring layer using the photoresist film pattern as a mask.

5 Claims, 2 Drawing Sheets

METHOD FOR FABRICATING METAL WIRING

TECHNICAL FIELD

The present disclosure relates to metal wiring of a semiconductor device and, more particularly, to a method for fabricating the metal wiring.

BACKGROUND

Semiconductors have advanced to be highly integrated and to operate at high speed and low voltage. There has been a great deal of research and development in connection with the reduction of the design rule and adaptation of new materials and processes. For example, some efforts have been directed to the utilization of copper wiring and low-k material to reduce the resistance X capacitance (RC) delay. Copper wiring has a low resistivity in comparison to conventional aluminum wiring and, as a result, reduces delay times and provides relatively high electro-migration (EM) and stress migration (SM) resistances, which results in advantageous electrical performance. Low-k materials such as diamond like carbon (DLC), carbon doped oxide (CDO) and the like are being considered for use in fabricating copper wiring in 90 nm or narrower line width process.

The copper wiring process differs from the conventional aluminum wiring process in several respects. First, in the aluminum wiring process, the aluminum wiring is formed by depositing an aluminum layer and carrying out a photolithography process and a reactive ion etching process. Sequentially, a dielectric layer is deposited to insulate the wiring from each other, and then the dielectric layer is planarized using chemical mechanical polishing to remove the topography on the surface of the dielectric layer.

Next, a via hole is formed to couple upper and lower wiring therethrough. The via hole is filled by depositing a metal layer such as a tungsten layer, and then the tungsten layer is planarized through a chemical mechanical polishing process.

Even though aluminum wiring can be easily patterned by depositing it and using a dry etch technique, it is relatively unlikely to be used because of its high resistivity. Accordingly, there have been efforts to form the wiring out of copper, which has a resistivity lower than that of the aluminum.

However, it is not easy to pattern the copper using dry etching and, as a result, the damascene process has been developed to form copper wiring. In the damascene process, after depositing the dielectric layer, a trench is formed using photolithography and a reactive ion etching process, and then the trench is filled with the copper by carrying out an electrochemical plating process. During the course of the electrochemical plating process, a barrier metal layer formed out of Ta/TaN and a Cu seed are typically required.

A dual damascene process forms the trench and the via hole at the same time and, as a result, is used for most of the copper wiring processes. In such copper wiring processes, the electrochemical plating process has characteristics different from the conventional deposition process. The conventional deposition process is characterized in that the copper is conformably deposited according to the formation of the lower pattern.

However, a case of the electrochemical plating the above-mentioned copper seed is needed for deposition of a hump in which a trench region has a step higher than non-trench regions also occurs. The hump characteristic is opposite to the characteristic shown in a chemical vapor deposition process, and it occurs by relatively increasing the electric charge at a dense pattern region. As the stepped height due to the hump increases, the amount of material that must be removed in the copper planarization process increases. The need to remove an increased amount of material increases defects such as dishing caused by non-uniformity in the wafer. Also, the electrochemical plating process is problematic in a mass production environment because of difficulties in controlling impurities and disposing of the wastewater. In addition, U.S. Pat. Nos. 4,855,016, 5,795,829, and 6,291,336 disclose methods for fabricating the metal wiring using aluminum-copper alloys.

DETAILED DESCRIPTION

The example methods disclosed herein may be used to fabricate metal wiring for semiconductors. In particular, the disclosed methods may facilitate formation of the wiring by patterning with a dry etching technique and may improve RC delay by reducing resistivity.

In one example, a semiconductor device has metal wiring formed by alternately depositing aluminum and copper layers so that the top and bottom layers are aluminum layers. Each of the aluminum and copper layers is formed at a thickness in the range of 3~2000 Å.

In another example, a method for fabricating metal wiring comprises forming a wiring layer having a predetermined thickness by alternately depositing aluminum and copper layers on a semiconductor substrate a predetermined number of times. The top layer of the wiring layer is an aluminum layer and a photoresist film pattern is formed on the wiring layer. The metal wiring is formed by performing a dry etching process using the photoresist film pattern as a mask.

Figure 1:
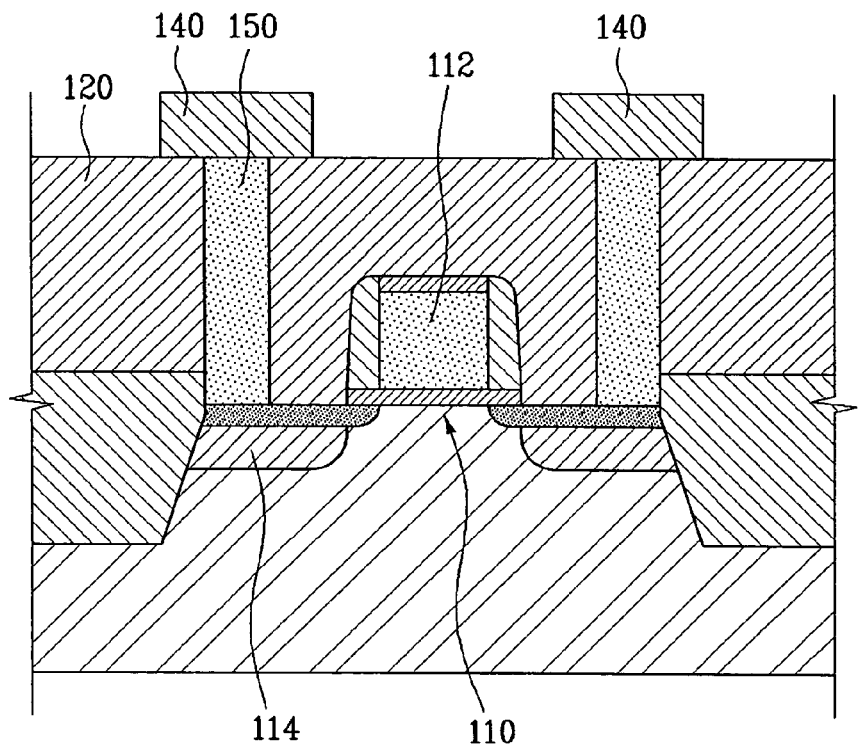
FIG. 1 is a schematic view illustrating a semiconductor device having metal wiring according to one example.

As shown in FIG. 1, lower structures including a transistor 110 are formed on a semiconductor substrate 100, and are isolated by means of a dielectric layer 120. The transistor 110 can be a MOS transistor having a gate 112 and a source/drain 114, or another type of transistor. Lower metal wiring 140 is formed on the dielectric layer 120, and the lower metal wiring 140 is electrically connected to electrodes of the transistor 110 through a contact 150. An interlayer dielectric layer (not shown) having a via hole (not shown) is formed over the lower metal wiring 140 such that the lower metal wiring 140 is electrically connected to upper metal wiring through the via.

Figure 2A:
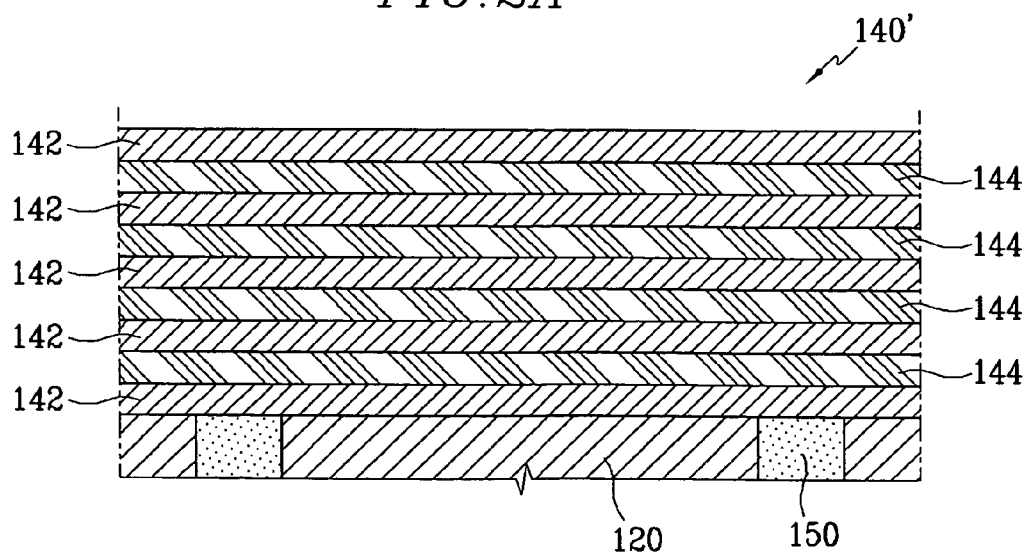
FIG. 2A to FIG. 2C depict an example method of fabricating the metal wiring in FIG. 1.
Figure 2B:
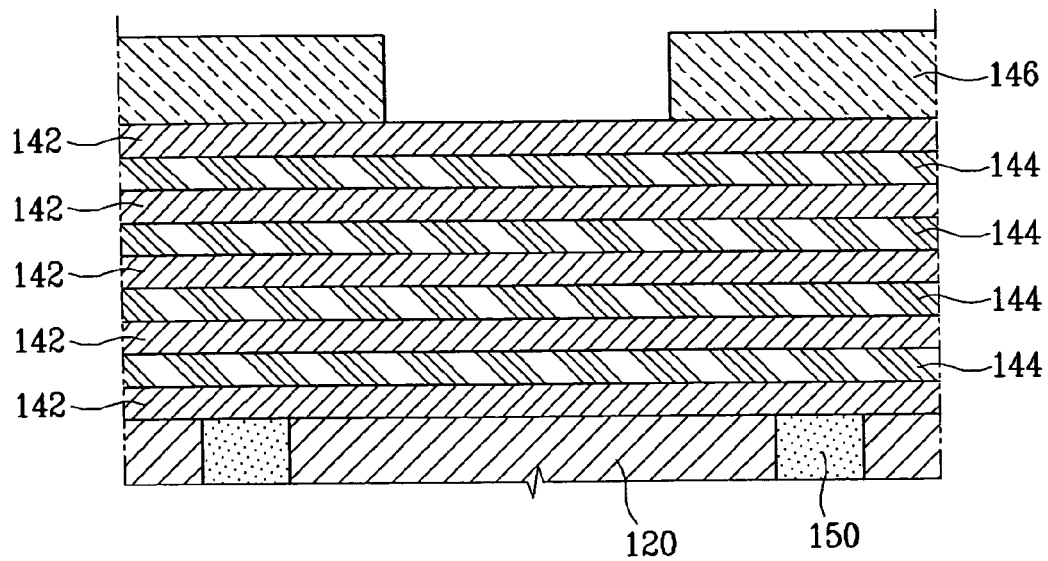

In the above-described semiconductor device, the lower metal wiring 140 can be formed by depositing a plurality of aluminum and copper layers. Formation of the lower metal wiring 140 is explained in greater detail below with reference to FIG. 2A to FIG. 2C.

In order to form the metal wiring 140, an aluminum layer 142 is formed by depositing aluminum on the dielectric layer 120 at a predetermined thickness using a sputtering or atomic layer deposition (ALD) technique. Next, a copper layer 144 is formed by depositing the copper on the aluminum layer 142 at a predetermined thickness, which is carried out through the same sputtering or ALD process used to form the aluminum layer 142. Preferably, the copper layer 144 is formed at a thickness in the range of 3~2000 Å. A thickness of less than 3 Å is not likely to improve the RC delay and a thickness over 2000 Å causes a problem in patterning the copper layer 144 during the course of a dry etching process. Also, the aluminum layer 142 can be formed at a thickness in the range of 3~2000 Å, based on the thickness of the copper layer 144. In this manner, the aluminum layer 142 and the copper 144 are alternately deposited a predetermined number of times such that the last one is the aluminum layer 142, resulting in formation of the wiring layer 140'. The aluminum layer 142 is formed as the uppermost layer because the aluminum 142 can be more easily patterned than the copper layer 144 during the patterning process using the dry etching.

After forming the wiring layer 140' at the predetermined thickness, and forming the photoresist film on the wiring layer 140', the photoresist film is patterned to form a photoresist pattern 146 using a photolithography process. Subsequently, the dry etching process, for example a reactive ion etching process, is performed using the photoresist film pattern 146 as a mask. Again, preferably, the aluminum layer 142 is arranged as the uppermost layer.

Figure 2C:
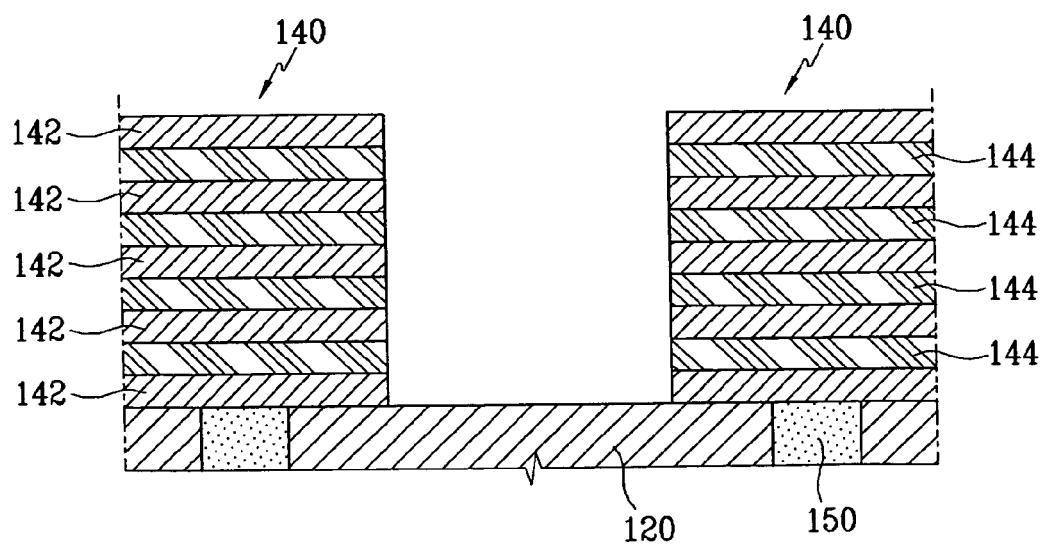

Accordingly, as in the conventional technique for forming the metal wiring by dry etching the aluminum, the dry etching starts with the wiring layer 140' and is then sequentially performed on the copper and aluminum layers 144 and 142 below the wiring layer 140' to fabricate the metal wiring 140 shown in FIG. 2C.

As described above, metal wiring is formed as a multilayer structure with aluminum and copper layers in which the uppermost one is an aluminum layer, which facilitates patterning the metal wiring through a dry etching process. Additionally, because the metal wiring formed as the multilayer structure, the resulting wiring has reduced resistivity in comparison with aluminum wiring, which reduces related RC delay.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method for fabricating metal wiring of a semiconductor device, comprising:

forming a metal wiring layer by alternately depositing an aluminum layer and a copper layer on a semiconductor substrate a predetermined number of times, wherein a top layer is an aluminum layer;

forming a photoresist film pattern on the metal wiring layer; and forming the metal wiring by performing an etching process on the metal wiring layer using the photoresist film pattern as a mask.

2. The method as defined in claim 1, wherein a bottom layer of the metal wiring layer is an aluminum layer.

3. The method as defined in claim 1, wherein at least one copper layer is formed at a thickness in the range of 3~2000 Å.

4. The method as defined in claim 1, wherein at least one aluminum layer is formed at a thickness in the range of 3~2000 Å.

5. The method as defined in claim 1, wherein the copper and aluminum layers are formed through a sputtering process or an atomic layer deposition (ALD) process.

* * * * *